US009332648B2

(12) United States Patent
Anosov et al.

(10) Patent No.: US 9,332,648 B2
(45) Date of Patent: May 3, 2016

(54) METHOD FOR PRODUCING CONDUCTIVE TRACKS

(71) Applicant: RMT Limited, Nizhny Novgorod (RU)

(72) Inventors: Vasiliy Sergeevich Anosov, Moscow (RU); Vasiliy Vasilevich Volodin, Moscow (RU); Gennadiy Gyusamovich Gromov, Moscow (RU); Elena Vladmirovna Mazikina, Moscow (RU); Aleksandr Aleksandrovich Nazarenko, Moscow (RU); Sergey Sergeevich Ryabov, Moscow (RU)

(73) Assignee: RMT Limited, Nizhny Novgorod (RU)

( * ) Notice: Subject to any disclaimer, the term of this patent is extended or adjusted under 35 U.S.C. 154(b) by 0 days.

(21) Appl. No.: 14/403,922

(22) PCT Filed: Feb. 14, 2013

(86) PCT No.: PCT/RU2013/000116
§ 371 (c)(1),
(2) Date: Nov. 25, 2014

(87) PCT Pub. No.: WO2013/184028
PCT Pub. Date: Dec. 12, 2013

(65) Prior Publication Data
US 2015/0173202 A1 Jun. 18, 2015

(30) Foreign Application Priority Data
Jun. 7, 2012 (RU) .................. 2012123608

(51) Int. Cl.
*H05K 3/02* (2006.01)
*H05K 3/06* (2006.01)
(Continued)

(52) U.S. Cl.
CPC ............ *H05K 3/065* (2013.01); *H01L 21/4846* (2013.01); *H01L 23/498* (2013.01);
(Continued)

(58) Field of Classification Search
CPC ......... H05K 3/06; H05K 3/065; H05K 3/067; H05K 3/244; H05K 1/0306; H05K 2201/0338; H05K 2203/107; H01L 21/4846; H01L 23/498; H01L 2924/0002; H01L 2924/00; Y10T 29/49155; Y10T 29/49156
USPC ............ 29/846, 847; 174/254; 216/48, 65, 78
See application file for complete search history.

(56) References Cited

U.S. PATENT DOCUMENTS 4,960,489 A 10/1990 Roeska et al.
5,104,480 A * 4/1992 Wojnarowski ....... H01C 17/242
216/48

(Continued)

FOREIGN PATENT DOCUMENTS

RU 2010462 C1 3/1994
RU 2338341 C2 1/2008

*Primary Examiner* — Donghai D Nguyen
(74) *Attorney, Agent, or Firm* — Andrew W. Chu; Craft Chu PLLC

(57) ABSTRACT

The method for producing conductive tracks includes applying continuous metallization layers to a non-conductive substrate, forming a metallization pattern, and applying to the formed tracks a protective barrier layer and a layer for soldering and/or welding elements of parts to the conductive tracks. The continuous metallization layers are applied by consecutively applying an adhesive layer, a conductive layer, and a metal layer, acting as a mask, to the non-conductive substrate. To form the metallization pattern, a mask is formed by laser ablation on sections of the metal layer not occupied by conductive tracks, then selective chemical etching removes the conductive layer and adhesive sublayer from the exposed sections, and selective chemical etching removes the mask, after which the protective barrier layer and layer for soldering and/or welding are applied.

5 Claims, 4 Drawing Sheets

Deposition of metal layers onto substrate (1): adhesion sub-layer (2), conductive layer (3), mask layer (7)

Laser opening of mask

Chemical etching of opened regions

Removal of mask layer

Chemical application of barrier layer (4) and layer for soldering (5)

*Main Stages of the Claimed Method*

(51) Int. Cl.
*H05K 3/24* (2006.01)
*H01L 23/498* (2006.01)
*H01L 21/48* (2006.01)
*H05K 1/03* (2006.01)

(52) U.S. Cl.
CPC ....... *H05K 3/244* (2013.01); *H01L 2924/0002* (2013.01); *H05K 1/0306* (2013.01); *H05K 2201/0338* (2013.01); *H05K 2203/107* (2013.01); *Y10T 29/49156* (2015.01)

(56) References Cited

U.S. PATENT DOCUMENTS

| 7,064,446 | B2 | 6/2006 | Barnak et al. |
| 7,523,548 | B2* | 4/2009 | Kataoka ................... H05K 3/06 29/846 |
| 2009/0211786 | A1* | 8/2009 | Bamba ................... H05K 3/067 29/846 |
| 2010/0009094 | A1 | 1/2010 | Lochtman et al. |

* cited by examiner

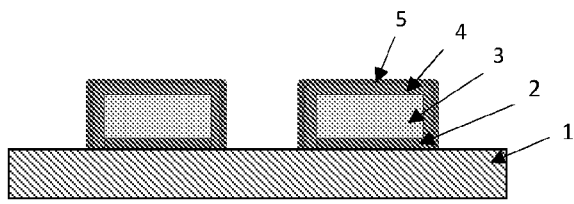
Fig. 1 Metallization Pattern:
1 – Substrate; 2 – Adhesion sub-layer; 3- Conductive layer; 4 – Protective barrier layer; 5 – Layer for soldering, welding
PRIOR ART
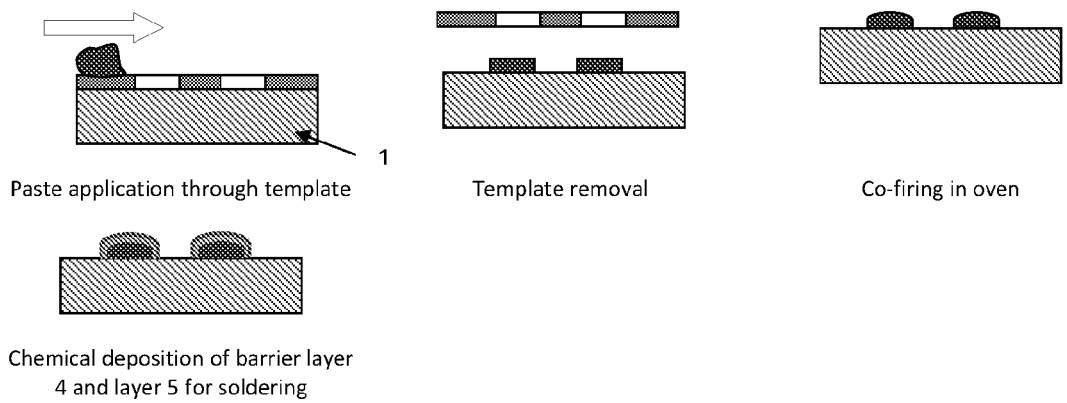
Paste application through template    Template removal    Co-firing in oven
Chemical deposition of barrier layer 4 and layer 5 for soldering
Fig. 2 – Main Stages of Thick-Film Technology:
1 – Substrate, 4- Barrier layer, 5- Layer for soldering.
PRIOR ART

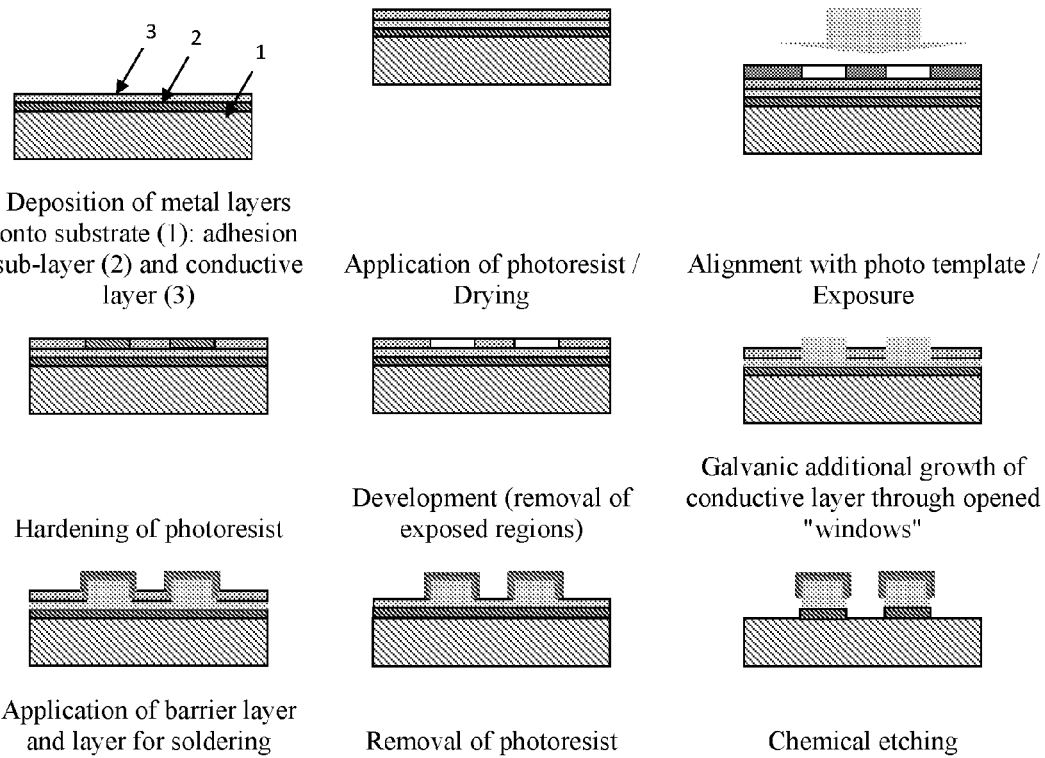
*Fig. 3* – *Main Stages of Thin-Film Technology:*
*1 – Substrate; 2 – Adhesion sub-layer and 3 – Conductive layer.*
PRIOR ART
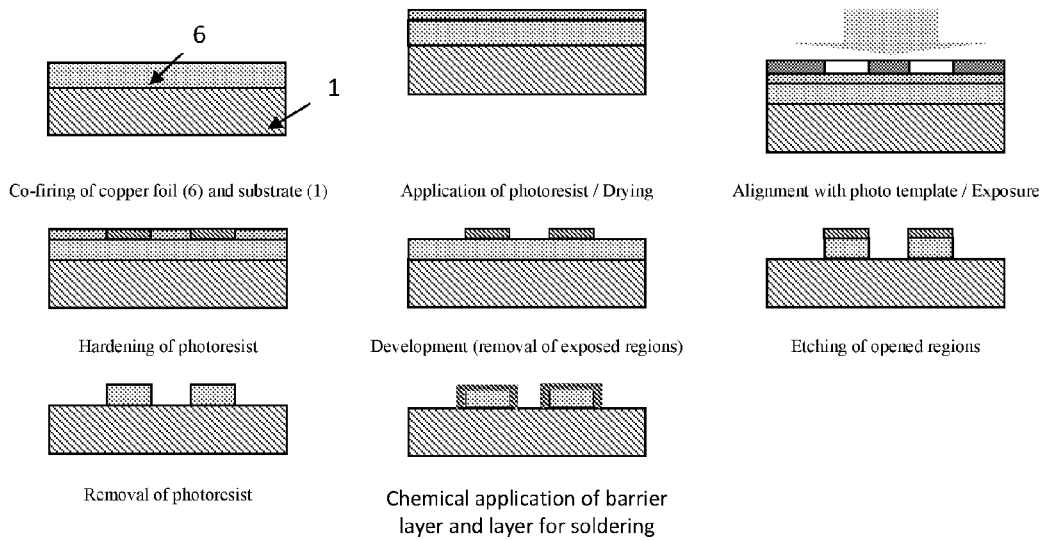
*Fig. 4* – *Main Stages of DBC Technology:*
*1 – Substrate; 6 – Copper foil.*
PRIOR ART

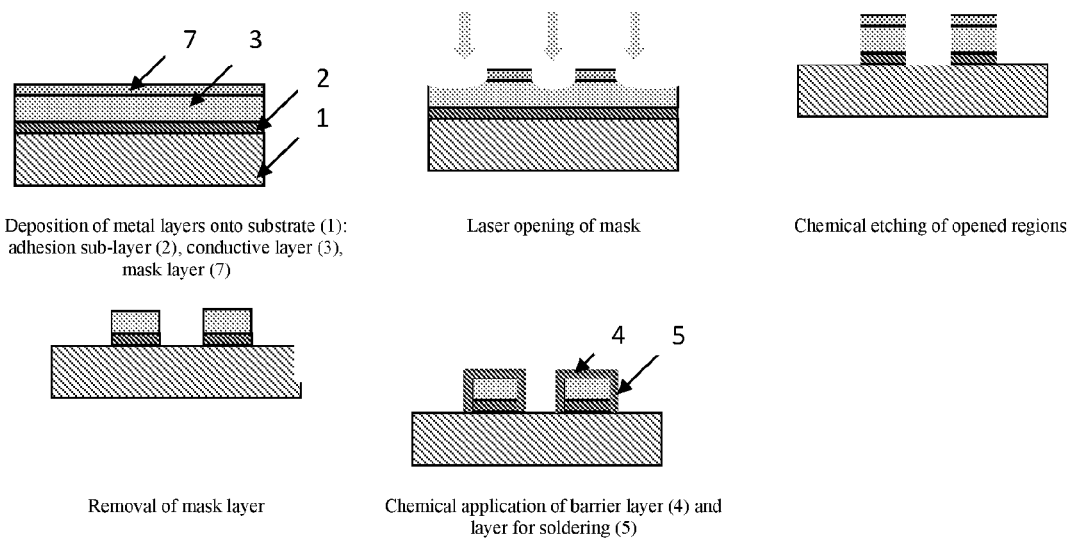
Fig. 5 – Main Stages of the Claimed Method

Illustrations to Methods Described
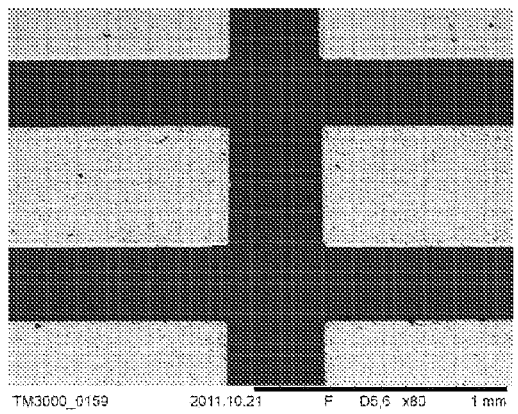
a)
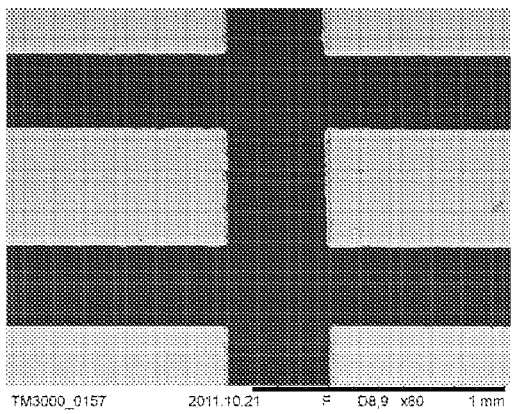
a)
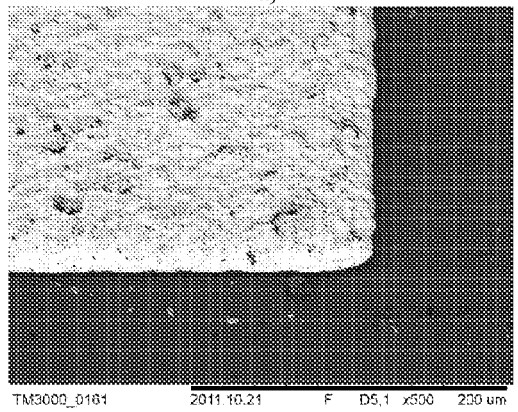
b)
*Fig. 6 - Metallization Pattern Produced by Thin-Film Technology (Prototype) PRIOR ART*
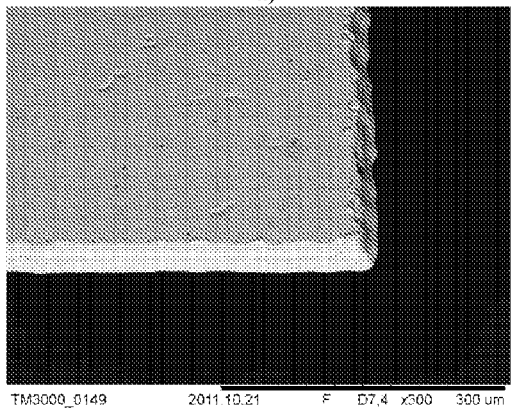
b)
*Fig. 7 – Metallization Pattern According to Claimed Method*
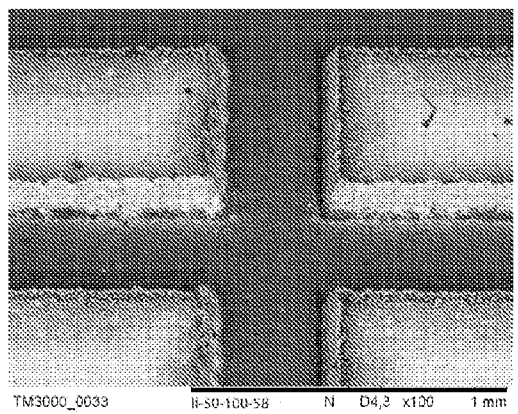
a)
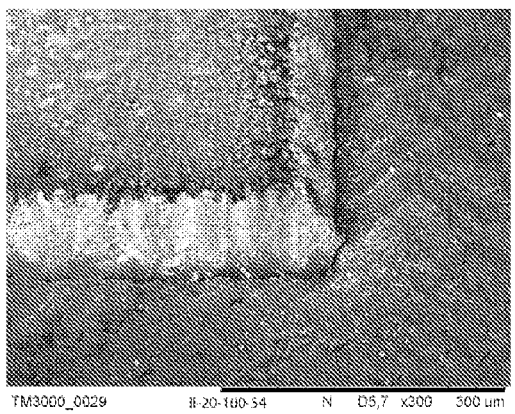
b)
*Fig. 8 – Production of Metallization Pattern by Direct Laser Opening (Ablation) of Metallization (Laser Engraving)*

METHOD FOR PRODUCING CONDUCTIVE TRACKS

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

1. Field of the Invention

The invention may be used for forming conductive tracks in electronics, microelectronics, and for switching electronic circuits and semiconductor devices.

2. Description of Related Art Including Information Disclosed Under 37 CFR 1.97 and 37 CFR 1.98.

Conductive tracks are conductive metallization patterns, mainly used on non-conductive ceramic substrates. Most frequently, such conductive patterns consist (see FIG. 1) of a layer of a conductive metal, for example, copper. In some cases, in order to improve adhesion of such a layer to the substrate surface, a thin adhesion layer is positioned therebetween. In order to protect copper against oxidation and copper migration, a copper layer is covered with a barrier layer, for example, a nickel barrier layer. Since such tracks are subsequently subjected to soldering and micro-welding, an upper layer is applied thereon, which may consist of gold (for soldering, welding) or tin (for soldering).

The following methods for producing conductive patterns are known in the art.

Thick-film technology. The most conventional and cheap technology is the so-called "thick-film" technology [1] that comprises application of special metal-containing pastes onto ceramics through a template with subsequent paste co-firing with the ceramics at a high temperature and simultaneous removal of binders and formation of a metal layer (FIG. 2).

This method does not require expensive equipment and exhibits high productivity. A cost of this process for a single product is the lowest among all the methods applied. This method finds wide use due to its cheapness, a short production cycle and high productivity.

Its drawbacks are:
low resolution of such metallization patterns. This is associated both with limitation of templates as to accuracy, and with inevitable dithering of a pattern during co-firing. Resolution ranging from 0.1 to 0.2 mm is insufficient for microelectronic production sites wherein high resolution is required, better in the range from 0.05 to 0.02 mm;
palladium silver-containing pastes are conventionally used for creating patterns. These pastes have comparatively low co-firing temperatures. But the negative fact is the presence of silver. Silver is an impurity with abnormal mobility, and this impurity diffuses, thus impairing parameters of devices having such a pattern. More acceptable are copper-containing pastes that have a higher temperature of the co-firing process. Substitution of more advantageous copper pastes for silver-containing ones requires higher co-firing temperatures in ovens and applying vacuum. This increases the process costs significantly;
poor controllability of metallization thickness. Non-ideal surfaces of metal patterns having sloped edges and high roughness;
substrate types suitable for co-firing with metal-containing pastes are limited.

Thin-film technology. The so-called thin-film technology used for creating a metallization pattern is most suitable for producing high-resolution metallization patterns. This technology is typically used in the microelectronic industry for producing contact layers, e.g., in the production of UHF instruments [2].

The method for creating a conductive pattern comprises vacuum deposition of an adhesive metal layer (chrome, nichrome, tantalum, etc.), deposition of a thin copper layer, photolithographic creation of a pattern (application of a photoresist, its exposure and development), additional galvanic growth of the copper layer to a required thickness and a nickel barrier layer. Then, the photoresist layer is removed, and the continuous layer is etched. A layer of gold or tin (containing bismuth) is applied over the conductive layer for solderability.

The method is ideal for producing high-resolution metallization patterns and controlling layer thicknesses.

The main drawbacks of the method result from many stages of the process and its long cycle, the stages requiring complex and high-precision equipment:
multi-stage process;
high-precision and expensive equipment.

A metallization pattern itself has several drawbacks, namely:
a galvanically produced conductive layer has poorer properties as compared to a voluminous material or layers produced by vacuum deposition;
the surface of a galvanically produced layer has increased roughness;
due to the technology used, underetching is inevitable in the base of pattern elements, and the protective layer does not fully covers the conductive layer (FIG. 3).

DBC technology. Stands for "Direct Bonded Copper" [3] and means creation of a metallization pattern in a copper layer in the form of a thin foil that is co-fired with a ceramic substrate.

The surface of a ceramic substrate is covered with a thin sheet of a foil. Then, copper is sintered with the substrate by applying pressure and temperature.

Then, a pattern is produced on the copper surface by using the technology similar to production of PCBs, namely, photolithography with subsequent etching of the pattern (FIG. 4).

The drawbacks are:
due to the technological limitations, thicknesses of such a copper pattern may not be less than 100-125 microns. It is a very big copper thickness for subsequent creation of a metallization pattern having a quality resolution. A significantly lower thickness—15-40 microns, not more—is required for many applications;
the cost of such a product is very high, significantly higher than that of a heat-transfer in the thin-film technology.

SUMMARY OF THE INVENTION

The closest to the claimed method (the prototype) is the method for producing conductive tracks by the thin-film technology [2].

The claimed method has the following advantages, as compared to the closest analogous solution:

1. the production process is significantly shorter:
   the process of additional growth of a conductive layer is eliminated;
   the multi-stage photolithographic process is eliminated;
   the necessity of producing metallization pattern masks is eliminated.
2. The quality of a conductive layer is improved. A vacuum-deposited conductive layer has better electric quality parameters, as compared to a layer produced by a galvano-chemical method. Such a layer also has better electric quality parameters than a layer produced with the use of the thick-film technology.

Unlike the DBC technology, the claimed method provides for the possibility of setting a required thickness of a metallization layer in a wide range.

3. The use of high-precision and expensive equipment set for photolithography (machines for alignment and exposure, application and development of photoresist) is eliminated.
4. The claimed method is more flexible in use, unlike all the methods mentioned above. A required pattern is produced by a laser aided by a programmable manipulator, it may be reset and corrected quickly. According to the thin-film technology, each type of metallization pattern requires that a mask be made first. According to the thick-film technology as well as in the DBC technology, a template should be made.

Higher productivity. Since the stage of direct "drawing" of a metallization pattern requires less time (takes only several minutes), as compared to the process of producing a pattern by photolithography (a long cycle taking up to several hours), high productivity is achieved in addition to flexibility.

The proposed technology of applying conductive patterns differs from those mentioned above by high quality of a metallization pattern, a limited number of process operations, flexibility and high productivity.

The method consists in: (1) applying a continuous conductive multilayered coating onto a non-conductive substrate by a deposition method (for example, by a magnetron deposition method). The coating should comprise an adhesive sub-layer ensuring required adhesion between the substrate and the metallization layer, a conductive layer made of a metal having good electric conduction, and an upper metal layer serving as a mask for the subsequent operations.

Then, (2) the obtained metallization layer is exposed to action of a laser (preferably operated in the short-impulse mode), so a mask portion is evaporated, and, during this process the conductive layer may be partially evaporated also. In this way, a "metallization pattern is developed". Still further, (3) the substrate, after being irradiated by a laser, is etched in a chemical solution, selective etching agents not dissolving the mask material, but etching the conductive layer and the adhesion sub-layer in regions cleared from the mask.

Yet further, (4) another selective chemical etching agent is used for treatment that removes the mask, but does not interacts with the conductive layer and the adhesion sub-layer.

Still further, (5) a barrier layer of, e.g., nickel, is deposited over the prepared surface. It is covered (6), also by chemical deposition, with a layer making the surface solderable (and/or weldable); and this may be a layer of immersion gold or tin.

The continuous metallization layers are applied, advantageously, by magnetron deposition in a single process cycle during one procedure.

Chrome is used as the material of the adhesion layer, copper is used as the material of the conductive layer, and vanadium is used as the material of the metal layer serving as the mask.

The metal layer serving as the mask may be produced by successively depositing vanadium and titanium onto the substrate.

The chemical properties of the mask material differ from those of the conductive layer and the adhesion sub-layer; thus, initially the conductive layer and the adhesion sub-layer are selectively dissolved in a chemical etching agent, the mask layer being not dissolved; and then another etching agent is used for selectively dissolving the mask layer, the conductive layer and the adhesion sub-layer being not dissolved.

It is also known that a pattern on a metal surface may be produced by selective ablation with the use of laser irradiation; this is laser engraving. During laser engraving a metallization layer, which is applied onto a non-conductive substrate preliminarily, is evaporated, and a preset pattern is achieved.

However, the technology of this "direct drawing" has a number of disadvantages, namely:

1) The ablation process under the action of laser irradiation is controlled insufficiently. An amount of evaporated material depends greatly on many external parameters (optical characteristics of a surface, temperature in the ablation area, stability of a laser beam and its spatial uniformity). Due to this, a low speed is required for high-precision ablation, otherwise metallization may not be removed as required, or a laser irradiation may act on the substrate and damage it (FIG. 7).

2) Moreover, metallization removal to a great depth results in settling of a great portion of ablation products near the action area. Due to this, the surface with the remaining pattern is contaminated significantly (FIG. 7).

In effect, one stage of the claimed method is laser engraving. However, it is used in the claimed technical solution only for opening with laser irradiation a thin mask layer with subsequent chemical etching ("development" of the pattern) for removing the conductive layer in the open regions. High precision and great power of laser action are not required, since a total amount of the material to be removed is small (a mask layer only). Accordingly, the process speed is increased significantly.

BRIEF DESCRIPTION OF THE DRAWINGS

FIG. 1 shows a schematic view of the typical structure of metallization tracks. A metallization track on a non-conductive substrate (1) usually consists of an adhesion sub-layer (2), if necessary, a main conductive layer (3), a barrier layer (4) preventing the material from diffusing out of the conductive layer and preventing a layer (5) intended for soldering or welding from being oxidized.

FIG. 2 shows a schematic view of the main stages of producing a microchip layout according to the thick-film technology: a) a layer of a special paste comprising a conductive composition is applied onto the surface of a non-conductive substrate (1) through a template; b) the template is removed from the substrate surface; c) the substrate with an applied pattern consisting of the applied paste in placed into an oven where the paste is melted and volatile and binding components are removed out of it; d) a barrier layer (4) and, over it, a layer (5) for soldering or welding the microchip elements are applied chemically onto the conductive tracks.

FIG. 3 shows another schematic view of the main stages of producing a microchip layout according to the thin-film technology: a) thin metal layers, namely, an adhesion sub-layer (2) and, over it, a thin layer of a conductive metal or alloy (3), are deposited onto a non-conductive substrate (1); b)-e) a pattern is created by photolithography on the coated surface in a photoresist layer with opened regions—windows, the opened regions being portions of the layout conductive tracks; f) additional galvanic growth of the conductive layer thickness is performed in the opened regions; g) the barrier layer (4) and the layer (5) for soldering or welding of the microchip elements to the conductive tracks are applied galvanically over the additionally grown conductive layer; h) the photoresist layer is removed; i) the continuous metallization layer, as located under the removed photoresist layer, is removed by chemical etching.

FIG. 4 shows another schematic view of the main stages of producing a microchip layout according to the DBC technology: a) a thin copper foil (6) is applied onto the surface of a non-conductive substrate (1) and is co-fired with the substrate surface under action of a pressing force and an elevated temperature in an oven; b)-e) a pattern is created by photolithography on the coated surface in a photoresist layer with opened regions—windows, the photoresist closing portions of the layout conductive tracks; f) the copper layer is removed from the opened regions by chemical etching; g) the photoresist is removed; h) the barrier layer (4) and the layer (5) for soldering or welding of the microchip elements to the conductive tracks are applied chemically over the conductive tracks.

FIG. 5 shows a schematic view of the main stages of producing a microchip layout according to the claimed method: a) the adhesion sub-layer (2), the conductive layer (3) of a required thickness and the mask layer (7) are applied onto the non-conductive substrate (1) in a single process; b) the mask layer is evaporated from regions that are not occupied by the layout track pattern, partial ablation of the conductive layer (3) being allowed; c) the metallization conductive layer (3) and the adhesion sub-layer (2) are removed from opened regions of the pattern by selective chemical etching; d) the mask layer (7) is removed with the use of another selective etching agent, without dissolving the conductive layer (3) and the adhesion sub-layer (2); e) the barrier layer (4) and the layer (5) for soldering or welding of the microchip elements to the conductive tracks are applied chemically onto the resulting conductive tracks.

FIG. 6 shows an image view of the aluminum-oxide ceramic substrate surface with tracks (the adhesion sub-layer—Cr, the conductive layer—Cu, the barrier layer—Ni, the layer for welding—Sn), as produced by the thin-film technology; (a) magnification 80×, and (b) magnification 500×.

FIG. 7 shows an image view of the aluminum-oxide ceramic substrate surface (polycor) with tracks (the adhesion sub-layer—Cr, the conductive layer—Cu, the barrier layer—Ni, the layer for soldering—Au), as produced by the claimed method; (a) magnification 80×, and (b) magnification 500×.

FIG. 8 shows an image view of the aluminum-oxide ceramic substrate surface with a pre-applied metal layer (the sub-layer—Cr, the conductive layer—Cu); the conductive layer pattern is produced by laser ablation of the conductive layer and the adhesion sub-layer.

DETAILED DESCRIPTION OF THE DRAWINGS

Example 1

A multilayer metal coating comprising the layers which characteristics are shown in Table 1 is applied onto a polished ($R_a$<0.1) ceramic substrate made of aluminum oxide (polycor) by magnetron deposition in a single process. This deposition of a multilayer coating in a single process is performed at a magnetron unit having a corresponding set of magnetron targets (Cr, Cu, V).

Then, selective ablation of the upper thin layer of the vanadium mask is carried out on the substrate surface according to a pre-set program in a pulse laser unit designed for engraving patterns with the use of laser beam scanning. The track regions remain non-evaporated. The laser irradiation parameters are shown in Table 2.

Further, copper is etched down to the chrome sub-layer in a selective chemical etching agent (the etching composition and conditions are shown in Table 3). This selective etching agent does not dissolve the vanadium pattern and the chrome sub-layer.

Still further, the chrome sub-layer is etched in a selective etching agent (the etching composition and conditions are shown in Table 3), the vanadium pattern and copper being not etched.

Yet further, the vanadium mask is removed with the use of a third selective etching agent (the etching composition and conditions are shown in Table 3), the etching agent not interacting with copper of the conductive track pattern and the chrome sub-layer.

After the above stages of selective etching are completed, the pattern of conductive tracks consisting of the chrome sub-layer and the main conductive copper layer remains on the surface.

Then, a nickel barrier layer is deposited chemically onto the conductive track surfaces, and, after that, a gold layer is also chemically deposited thereon.

TABLE 1

Composition and parameters of metallization layers applied in a single process (magnetron deposition) and their purpose

| Layer # from the surface | Layer composition | Thickness, microns | Purpose |
| --- | --- | --- | --- |
| 1 | Vanadium (V) | 1 | Single-layer mask |
| 2 | Copper (Cu) | 20 | Conductive layer |
| 3 | Chrome (Cr) | 0.05 | Adhesion sub-layer |

TABLE 2

Parameters of laser irradiation for removing the mask layer

| Laser type | Irradiation wavelength | Pulse duration | Pulse repetition rate | Average power | Beam scanning speed on surface |
| --- | --- | --- | --- | --- | --- |
| Fiber laser | 1.064 microns | 100 ns | 20 kHz | 8 W | 100 mm/s |

TABLE 3

Parameters of selective etching agents and etching modes for producing a contact tracks metallization pattern

| Etching agent # | Purpose | Etching agent composition | Etching period | Additional conditions |
| --- | --- | --- | --- | --- |
| 1 | Etching of a copper conductive layer | $CrO_3$ - 150 g/L $HNO_3$ - 5 ml/L HCl - 10 ml/L | 5 min | Vigorous stirring Room temperature |
| 2 | Etching of a chrome adhesion sub-layer | $HCl:H_2O$ - 1:1 | 5 min | Room temperature |
| 3 | Etching of a vanadium mask | conc. $H_2O_2$ | 2 min | Room temperature |

Example 2

A multilayer metal coating comprising the layers which characteristics are shown in Table 4 is applied onto a polished ($R_a$<0.6) ceramic substrate made of aluminum nitride by magnetron deposition in a single process. A two-layer vanadium/titanium coating is deposited as the mask in this process. The two-layer strengthened mask is required due to the developed rough surface of the substrate. Due to this, the mask substrate will have higher roughness, and, in order to strengthen its protective properties, a more complex (two-layer) coating is required, as opposed to the case with the polished surface of the substrate.

This deposition of a multilayer coating in a single process, i.e., in a single production cycle, is performed at a magnetron unit having a corresponding set of magnetron targets (Cr, Cu, V, Ti).

Then, selective ablation of the upper layer of the mask that consists of thin layers of vanadium and titanium is carried out on the substrate surface according to a pre-set program in a pulse laser unit designed for engraving patterns with the use of laser beam scanning. The track regions remain non-evaporated. The laser irradiation parameters are shown in Table 5.

Further, copper is etched down to the chrome sub-layer in a selective chemical etching agent (the etching composition and conditions are shown in Table 6). This selective etching agent does not dissolve vanadium and titanium of the two-layer mask and the chrome sub-layer.

Still further, the chrome sub-layer is etched in a selective etching agent (the etching composition and conditions are shown in Table 6), vanadium and titanium of the two-layer mask and copper being not etched.

Yet further, the vanadium and titanium layers of the two-layer mask are removed with the use of a third selective etching agent (the etching composition and conditions are shown in Table 6), the etching agent not interacting with copper of the conductive track pattern and the chrome sub-layer.

After the above stages of selective etching are completed, the pattern of conductive tracks consisting of the chrome sub-layer and the main conductive copper layer remains on the surface.

Then, a nickel barrier layer is deposited chemically onto the conductive track surfaces, and, after that, a gold layer is also chemically deposited thereon.

TABLE 4

Composition and parameters of metallization layers applied in a single process (magnetron deposition) and their purpose

| Layer # from the surface | Layer composition | Thickness, microns | Purpose |
|---|---|---|---|
| 1 | Titanium (Ti) | 1 | Two-layer mask |
| 2 | Vanadium (V) | 1 | |
| 3 | Copper (Cu) | 20 | Conductive layer |
| 4 | Chrome (Cr) | 0.05 | Adhesion sub-layer |

TABLE 5

Parameters of laser irradiation for removing the mask layer

| Laser type | Irradiation wavelength | Pulse duration | Pulse repetition rate | Average power | Beam scanning speed on surface |
|---|---|---|---|---|---|
| Fiber laser | 1.064 microns | 100 ns | 20 kHz | 8 W | 100 mm/s |

TABLE 6

Parameters of selective etching agents and etching modes for producing a contact tracks metallization pattern

| Etching agent # | Purpose | Etching agent composition | Etching period | Additional conditions |
|---|---|---|---|---|
| 1 | Etching of a copper conductive layer | $CrO_3$ - 150 g/L $HNO_3$ - 5 ml/L HCl - 10 ml/L | 5 min | Vigorous stirring Room temperature |
| 2 | Etching of a chrome adhesion sub-layer | $HCl:H_2O$ - 1:1 | 5 min | Room temperature |
| 3 | Etching of a mask vanadium layer | conc. $H_2O_2$ | 2 min | Room temperature |
| 4 | Etching of a mask titanium layer | $KOH_{4\%}:HF_{conc.}$ = 10:2 | 10 s | Room temperature |

We claim:

1. A method for producing conducting tracks, comprising the steps of:
    applying continuous metallization layers onto a non-conductive substrate;
    forming a metallization pattern comprising tracks and conductive tracks; and
    applying a protective barrier layer onto the formed tracks and applying an attachment layer for attaching element parts onto the formed conductive tracks, said element parts being one of a group consisting of soldered, welded, or both by said attachment layer,
    wherein the step of applying continuous metallization layers comprises: successively applying an adhesion sub-layer, a conductive layer and a metal layer serving as a mask onto the non-conductive substrate, and
    wherein the step of forming the metallization pattern, comprises:
        forming the mask by laser ablation on regions of the metal layer, said metal layer serving as the mask and said regions not occupied by the conductive tracks;
        removing the conductive layer and the adhesion sub-layer in opened regions by selective chemical etching;
        removing the mask by selective chemical etching; and then
        applying the protective barrier layer and the attachment layer.

2. The method according to claim 1, wherein the step of applying continuous metallization layers is by a magnetron deposition method in a single process cycle.

3. The method according to claim 1, wherein material for the adhesion sub-layer is comprised of chrome, wherein material for the conductive layer is comprised of copper, and wherein material for the metal layer is comprised of vanadium.

4. The method according to claim 1, wherein the metal layer is applied by successive deposition of vanadium and titanium onto the substrate.

5. The method according to claim 1, wherein chemical properties of material of the mask differ from chemical properties of material of the conductive layer and material of the adhesion sub-layer so as the conductive layer and the adhesion sub-layer are selectively dissolved in a chemical etching agent or agents first, while the mask is not dissolved, and further the mask is selectively dissolved in another etching agent while the conductive layer and the adhesion sub-layer are not dissolved.

* * * * *